(12) United States Patent
Heintze et al.

(10) Patent No.: US 8,211,323 B2
(45) Date of Patent: Jul. 3, 2012

(54) METHOD FOR THE REMOVAL OF DOPED SURFACE LAYERS ON THE BACK FACES OF CRYSTALLINE SILICON SOLAR WAFERS

(75) Inventors: Moritz Heintze, Ulm (DE); Rainer Moeller, Dresden (DE); Harald Wanka, Blaustein (DE); Elena Lopez, Dresden (DE); Volkmar Hopfe, Kleingiesshuebel (DE); Ines Dani, Lichtenau (DE); Milan Rosina, Genoble (FR)

(73) Assignees: Fraunhofer-Gesellschaft zur Forderung der Angewandten Forschung E.V., Munich (DE); Centrotherm Photovoltaics AG, Blaubeuren (DE)

( * ) Notice: Subject to any disclaimer, the term of this patent is extended or adjusted under 35 U.S.C. 154(b) by 975 days.

(21) Appl. No.: 11/917,679

(22) PCT Filed: Jun. 14, 2006

(86) PCT No.: PCT/DE2006/001058
§ 371 (c)(1),
(2), (4) Date: Aug. 14, 2008

(87) PCT Pub. No.: WO2006/133695
PCT Pub. Date: Dec. 21, 2006

(65) Prior Publication Data
US 2008/0305643 A1    Dec. 11, 2008

(30) Foreign Application Priority Data

Jun. 17, 2005 (DE) .................. 10 2005 029 154
Aug. 16, 2005 (DE) .................. 10 2005 040 596

(51) Int. Cl.
*B44C 1/22* (2006.01)
*H01L 21/302* (2006.01)

(52) U.S. Cl. ............. 216/67; 216/24; 216/58; 438/706; 438/710; 438/716

(58) Field of Classification Search ............. 216/24, 216/58, 67; 438/706, 710, 716
See application file for complete search history.

(56) References Cited

U.S. PATENT DOCUMENTS 3,795,557 A * 3/1974 Jacob .................... 216/67
(Continued)

FOREIGN PATENT DOCUMENTS
DE    10239875 A1    3/2004
(Continued)

OTHER PUBLICATIONS

Lee W J et al, "High-density hollow cathode plasma etching for large area multicrystalline silicon solar cells", Conference record of the 29th IEEE Photovoltaic Specialists Conference, vol. Conf.29, May 19, 2002, pp. 296-299, XP010666287.

(Continued)

*Primary Examiner* — Shamim Ahmed
(74) *Attorney, Agent, or Firm* — Millen, White, Zelano & Branigan, P.C.

(57) ABSTRACT

The invention relates to a method for the one-sided removal of a doped surface layer on rear sides of crystalline silicon solar wafers. In accordance with the object set, doped surface layers should be able to be removed from rear sides of such solar wafers in a cost-effective manner and with a handling which is gentle on the substrate. In addition, the front side should not be modified. In accordance with the invention, an etching gas is directed onto the rear side surface of silicon solar wafers with a plasma atmospheric pressure.

25 Claims, 1 Drawing Sheet

U.S. PATENT DOCUMENTS

Figure 1:
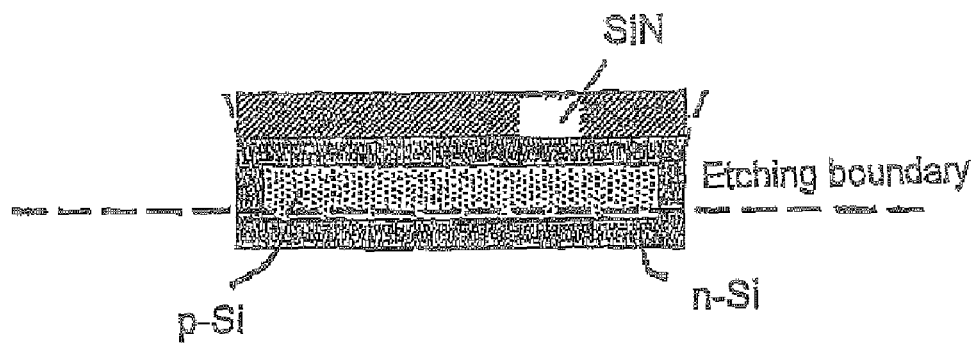

| | | | |
|---|---|---|---|
| 4,158,591 A | | 6/1979 | Avery et al. |
| 5,143,748 A | * | 9/1992 | Ishikawa et al. ............... 427/569 |
| 5,767,627 A | * | 6/1998 | Siniaguine ............... 315/111.41 |
| 5,961,772 A | * | 10/1999 | Selwyn .................... 156/345.39 |
| 6,559,408 B2 | * | 5/2003 | Smith et al. .............. 219/121.57 |
| 6,660,643 B1 | * | 12/2003 | Kardauskas et al. .......... 438/706 |

FOREIGN PATENT DOCUMENTS

| | | |
|---|---|---|
| EP | 0817250 A | 1/1998 |
| JP | 10-178194 * | 6/1998 |
| WO | WO 2004051702 A2 | 6/2004 |

OTHER PUBLICATIONS

Nositschka W A et al, "Texturisation of multicystalline silicon solar cells by RIE and plasma etching", Solar Energy Materials and Solar Cells, Elsevier Science Publishers, Amsterdam, NL, vol. 80 No. 2, Oct. 31, 2003, pp. 227-237, XP004464629.

Rentsch J et al, "Isotropic plasma texturing of mc-Si for industrial solar cell fabrication", Photovoltaic Specialists Conference, 2005, Conference Record of the Thirty-First IEEE Lake Buena Vista, Fl, USA, Jan. 3-7, 2005, Piscataway, NJ USA, IEEE, US, Jan. 3, 2005, pp. 1316-1319, XP010822999.

* cited by examiner

METHOD FOR THE REMOVAL OF DOPED SURFACE LAYERS ON THE BACK FACES OF CRYSTALLINE SILICON SOLAR WAFERS

The invention relates to a method for the one-sided removal of a doped surface layer on rear sides of crystalline silicon solar wafers. Such doped solar wafers are doped, for example with phosphor, on all sides by diffusion for the formation of a p/n transition at the surface of the wafer. In this connection, an n-doped barrier layer is formed over the whole surface. This is, however, where possible, only desired on the wafer surface onto which the light for a photovoltaic use should be incident (the so-called front side). At least the whole rear side and also the outer edge barrier layer should be electrically insulated from the front side so that the n-doped surface layer should be removed again there. A rear side then formed with a pure p-doped crystalline silicon can subsequently be provided with an electrical contacting.

The front side exposed to the light can be provided with a reflection-reducing layer or coating (e.g. $Si_xN_y$:H or $TiO_2$) before or also after the removal of the doped rear side layer.

The removal of the doped surface has previously mainly been performed in a wet chemical manner. In this connection, the individual cells, which are very shallow, are added to an etching bath and a removal of the doping layer on the rear side takes place. With a certain density of the etching bath and when observing certain boundary layer relationships, a liquid meniscus can form at the outer barrier which can also result in the partial removal of the doped material at the outer edge.

A constant monitoring and observation of the consistency of the etching bath suitable for this is required for this purpose, which is very time-consuming and/or costly.

In addition, destruction may occur on the handling of the individual solar wafer blanks, that is on the placing into and taking out of the etching baths, since the silicon substrates have a very low thickness in the range of some few hundred micrometers.

Care must furthermore be taken that no etching liquid or gaseous etching products come into contact with the front surface.

A removal of the side edges using laser radiation is likewise time-consuming and cost-intensive.

Further methods for the removal of the doped side edges ("edge insulation"), for example by dry etching processes in vacuum plants or for mechanical removal by grinding likewise have the disadvantage of cost and increase the probability of wafer damage due to time-consuming and/or costly handling processes.

It is therefore the object of the invention to provide a method by which doped surface layers of rear sides of crystalline silicon solar wafers can be removed in a cost-effective manner and with a handling of the solar wafers which is easy on the substrate. The front side should not be modified in this process so as not to have a negative effect on the cell efficiency.

In accordance with the invention, this object is solved by a method for the removal of a doped surface layer on rear sides of crystalline silicon solar wafers, wherein an etching gas is directed onto the rear side surface of silicon solar wafers with a plasma in the region of the atmospheric pressure. Advantageous aspects and further developments of the invention can be achieved using features designated described below.

In accordance with the invention, a procedure is followed in this connection such that a plasma source known per se is used, with which a large-area plasma with a working width preferably corresponding to the dimensions of the solar wafer (approx. 150-250 mm) can be formed, and work is carried out in the range of atmospheric pressure. In this connection, it is possible to work in a pressure range of approximately 300 Pa around the respective environmental atmospheric pressure.

Such plasma sources are described as an arc source or a microwave source in DE 102 39 875, with its disclosure content being used to a full extent with respect to the design and also the operation of such plasma sources.

The plasma can, however, also be formed by a dielectric discharge.

The plasma is discharged from at least one nozzle of the plasma source mixing with an etching gas or an etching gas mixture (so-called remote plasma etching). In a further variant, the etching gas can also be guided directly through the plasma source (so-called direct plasma etching). Radicals of the etching gas which are formed by the plasma energy result in a removal of the surface and the gaseous reaction products arising in this connection are guided off with the gas flow.

It is not absolutely necessary to expose the whole surface of the rear side to the plasma. It can be sufficient only to take account of regions, preferably barrier zones, of the rear side.

The proportion of the etching gas in the total gas flow should be selected such that an effective removal of the doped surface layer at the rear side free of residue is achieved, with the removal substantially taking place in a reaction region which is determined by the plasma being directly discharged from the plasma source.

The exhaust gas flow is then led off radially outwardly and flows parallel to the rear side surface at which the etching has been carried out and is removed via an extraction device.

The extraction device should be formed such that the reaction region is completely surrounded and should be operated such that a flow is formed which is as uniform as possible and in particular such that a stall can be avoided at the radially outer edge region of the respective solar wafer. An engaging round of etching can thereby be avoided and the total doped surface layer can be maintained on the front side of the solar wafer and the whole surface can be used for the photovoltaics on the operation of the cell.

For this purpose, the gas mixture should flow at a linear flow rate in the range of 1 to 20 m/s, preferably to 5 m/s, over the rear side surface.

The etching zone should additionally be sealed with respect to the environment by means of a purging gas supply. In this connection, an inert purging gas, e.g. nitrogen, is supplied. The purging gas supply should completely surround the extraction device and also the reaction region in this connection. Purging gas moves once outwardly through a gap between the rear side surface of the solar wafer and the plasma source to the environment and some of the purging gas is drained off via the extraction device.

Suitable etching gases are fluorine-containing gases such as $CF_4$, $CHF_3$, $SF_6$, $NF_3$ or chlorine compounds such as HCl, $CCl_4$, $SiHCl_3/H_2$. A gas mixture can also be used, for example by mixing in oxygen or hydrogen.

Etching gas should be supplied at 0.5 to 10, preferably up to 5, standard liters a minute, In addition, nitrogen can be added to the etching gas for dilution, with this taking place for $NF_3$ at 2 to 7, preferably up to 5, standard liters a minute.

There is, however, also the possibility of supplying oxygen with the etching gas, with this in particular being favorable with $CF_4$ und $SF_6$. Oxygen should be supplied at 0.3 to 1.5 standard liters a minute. The etching rate can be increased and the arising surface texture can be influenced using supplied oxygen.

The gas volume flows set forth for etching gas, purging gas and oxygen relate to the customary wafer dimensions of approx. 150 to 250 mm and can, however, be correspondingly adapted with larger areas of solar wafers.

Suitable etching gases and gas mixtures with achievable static and dynamic etching rates are set forth in Table I.

| Etching precursor | Static etching rate [µm/min] | Dynamic etching rate [µm/min] |
|---|---|---|
| $CF_4$ | 0.2 | 0.03 |
| $CHF_3$ | 0.02 | 0.003 |
| $SF_6$ | 2.9 | 0.3 |
| $SF_6/O_2$ | 6.8 | 0.7 |
| $NF_3$ | 11.5 | 1.4 |

A p/n transition region can also be removed on the rear side in accordance with the invention so that a complete p-n insulation on the rear side is achieved.

Nitrogen, argon, hydrogen and/oxygen can be used for the plasma formation, predominantly in the form of gas mixtures. Etching gases can be introduced directly into the plasma source, but also only into the already formed plasma.

The method can be operated continuously, with individual solar wafers being able to be moved in a translatory manner below a plasma source. The one slot nozzle or a plurality of nozzle openings from which plasma is discharged should be designed, arranged and dimensioned such that the total width is swept over orthogonally to the direction of movement of the solar wafers.

A plurality of nozzle openings from which plasma with free radicals and etching gas can be directed to the rear side surface are advantageously provided at one plasma source. The plasma source is made in this connection such that a gap is present between the plasma source and the rear side surface of solar wafers around the actual reaction region and gas can flow through said gap.

It is additionally advantageous to use the individual solar wafers in mounts of support elements with which they can be transported. In this connection, the mounts should be dimensioned such that the solar wafers can be received with an almost exact fit and only a small clearance remains between the mount and the outer barrier of the respective solar wafer. The rear side surface should end as flush as possible with the surface of a support element or only project slightly beyond it in its height.

In this manner, the filigree software wafers can be handled and transported in an easy and gentle manner so that damage or destruction can also be avoided.

The required space requirements of a plant for the carrying out of the method in accordance with the invention is small. A high throughput can be achieved and the operating costs are relatively low. In addition, impairments to the health can be avoided and the demands on labor protection are in particular considerably lower in comparison with wet chemical processes.

The solar wafers can already be provided with an antireflection coating before the carrying out of the process or also after it.

The surface quality of the rear side can also be modified by the influence of the plasma and a smooth finish with reduced surface roughness can be achieved. The efficiency of the solar wafers can thereby be improved. The improved surface properties also have a positive effect when a contacting is formed on the rear side or if an additional coating should be applied as a passivating coating. Particularly favorable dielectric layers, e.g. made of silicon nitride, can thus be deposited onto a correspondingly smoothed rear side surface.

The rear side of the solar wafer can be provided with a texture by the etching step, for example while forming an inverse pyramid texture with edge lengths in the micrometer range or while forming a nano-texture. An increase in the light ray path length inside the solar wafer and an increased absorption of light radiation can thus be achieved, which in particular results in an increase in efficiency in the operation of the completely processed solar wafers with thin wafers.

Figure 2:
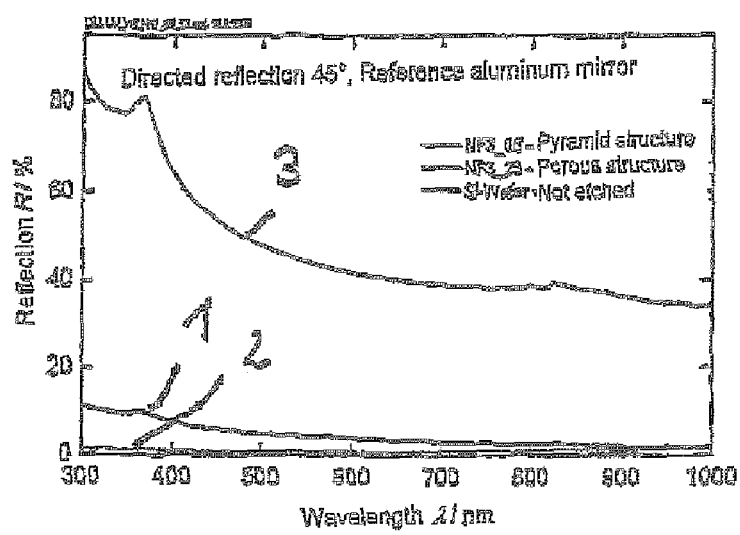

The reflectivity can in addition be reduced. This can also be seen from the diagram shown in FIG. 2. In this context, the reflectivity at a solar wafer has been determined after the carrying out of the process and without any additional antireflection coating. The curve shape 3 corresponds to an untreated solar wafer with high reflectivity. The curve shape 2 corresponds to a porous texture on the rear side and the curve shape 1 corresponds to a texture with a pyramid structure on the rear side.

The following table II shows textures formed on rear sides of silicon wafer with different etching gases after the removal of the doped layer.

TABLE II

| Etching gas | Gas flow (Standard liters/min) | Static etching rate [µm/min] | Surface texture REM image |
|---|---|---|---|
| SF6 | 5 | 3 |  |
| NF3 | 2 | 11.5 |  |

A schematic shape of a solar wafer is shown in FIG. 1 in which a region of the surface is processed by etching and a doped layer should be removed at least on the rear side and not on the front side.

An n-doped layer can also be removed in this manner instead of a p-doped layer.

The invention claimed is:

1. A method for the removal of a doped surface layer on a rear side of a crystalline silicon solar wafer, said method comprising:
   an etching gas is directed onto the rear side surface of said silicon solar wafer with a plasma in the region of the atmospheric pressure,
   wherein the etching gas flows parallel to the rear side surface while avoiding a stall at the radially outward edge region of said silicon solar wafer, and is led off by means of an extraction device surrounding and terminating the reaction region, and
   wherein the rear side surface is smoothed by the influence of the plasma and/or the surface roughness is reduced.

2. A method in accordance with claim 1, wherein a large area plasma is formed having a working width corresponding to the dimensions of said solar wafer.

3. A method in accordance with claim 1, wherein said etching gas is directed onto the rear side surface of said silicon solar wafer with a plasma in a pressure range of approximately 300 Pa around the respective environmental atmospheric pressure.

4. A method in accordance with claim 1, wherein said etching gas is guided along over the rear side surface at a flow rate in the range from 1 to 20 m/s.

5. A method in accordance with claim 1, wherein the reaction region is sealed by supply of a purging gas via a purging gas supply completely surrounding the extraction device and the reaction region.

6. A method in accordance with claim 1, wherein said etching gas comprises $CF_4$, $CHF_3$, $SF_6$, $NF_3$, or a chlorine compound.

7. A method in accordance with claim 1, wherein said etching gas is supplied at 0.5 to 10 standard liters a minute.

8. A method in accordance with claim 1, wherein said etching gas further comprises a dilution gas.

9. A method in accordance with claim 8, wherein said dilution gas is nitrogen.

10. A method in accordance with claim 8, said dilution gas is supplied at 2 to 7 standard liters a minute.

11. A method in accordance with claim 8, said etching gas comprises $NF_3$ and nitrogen.

12. A method in accordance with claim 1, wherein said etching gas additionally contains oxygen.

13. A method in accordance with claim 12, said etching gas comprises oxygen and $CF_4$ or $SF_6$.

14. A method in accordance with claim 12, wherein said oxygen is supplied at 0.3 to 1.5 standard liters a minute.

15. A method in accordance with claim 1, wherein free radicals of the etching gas are formed with the plasma energy and are directed into the reaction region with the plasma.

16. A method in accordance with claim 1, wherein nitrogen, argon, oxygen, hydrogen, or combinations thereof are used for the plasma formation.

17. A method in accordance with claim 1, wherein plasma with etching gas broken down at least partly into radicals is directed through a slot nozzle or a plurality of nozzle openings formed in an offset arrangement over the total width of said silicon solar wafer, and said silicon solar wafer is moved in a translatory manner orthogonal to the width of said silicon solar wafer below the plasma source.

18. A method in accordance with claim 1, wherein the plasma is directed at only regions of the rear side surface of said silicon wafer.

19. A method in accordance with claim 1, wherein the plasma is directed at only the outer peripheral zone of the rear side of said silicon wafer.

20. A method in accordance with claim 1, wherein said silicon solar wafer is inserted into mounts of a support elements.

21. A method in accordance with claim 1, wherein the source of plasma is an arc source or a microwave plasma source or the plasma is formed from a dielectrically impaired discharge.

22. A method in accordance with claim 1, surface of said silicon solar wafer is structured for a diffuse light reflection by the etching.

23. A method in accordance with claim 1, wherein said method is carried out as a continuous process.

24. A method in accordance with claim 6, wherein said etching gas comprises $CF_4$, $CHF_3$, $SF_6$, $NF_3$, HCl, $CCl_4$, or a mixture of $SiHCl_3$ and $H_2$.

25. A method in accordance with claim 6, wherein said etching gas further comprises oxygen or hydrogen.

* * * * *